(12) United States Patent
Huebner et al.

(10) Patent No.: US 10,665,153 B2
(45) Date of Patent: May 26, 2020

(54) ILLUMINATED DISPLAY

(71) Applicant: LightnTec GmbH & Co. KG, Karlsruhe (DE)

(72) Inventors: Manuel Huebner, Karlsruhe (DE); Florian Kall, Waldbronn (DE)

(73) Assignee: LIGHTNTEC GMBH & CO. KG, Karlsruhe (DE)

( * ) Notice: Subject to any disclaimer, the term of this patent is extended or adjusted under 35 U.S.C. 154(b) by 131 days.

(21) Appl. No.: 15/937,581

(22) Filed: Mar. 27, 2018

(65) Prior Publication Data

US 2018/0218669 A1 Aug. 2, 2018

Related U.S. Application Data

(63) Continuation of application No. PCT/EP2016/072994, filed on Sep. 27, 2016.

(30) Foreign Application Priority Data

Sep. 28, 2015 (DE) .................. 10 2015 218 610
Apr. 29, 2016 (DE) .................. 20 2016 102 308 U
Jun. 8, 2016 (DE) .................. 20 2016 103 036 U

(51) Int. Cl.
*G09G 3/32* (2016.01)
*H05K 1/02* (2006.01)
(Continued)

(52) U.S. Cl.
CPC ............. *G09G 3/32* (2013.01); *H05K 1/0274* (2013.01); *H05K 1/189* (2013.01); *H05K 3/341* (2013.01); *H05K 3/3494* (2013.01); *G09G 2320/0626* (2013.01); *G09G 2380/02* (2013.01); *H05K 1/028* (2013.01); *H05K 3/0011* (2013.01); *H05K 2201/015* (2013.01); *H05K 2201/0108* (2013.01); *H05K 2201/0145* (2013.01);
(Continued)

(58) Field of Classification Search
CPC ......... G09G 3/32; H05K 1/0277; H05K 1/028
See application file for complete search history.

(56) References Cited

U.S. PATENT DOCUMENTS 5,900,850 A 5/1999 Bailey et al.
8,872,924 B1 10/2014 Lin et al.
(Continued)

FOREIGN PATENT DOCUMENTS

CN 1917745 A 2/2007
CN 102105925 A 6/2011
(Continued)

*Primary Examiner* — Antonio Xavier
(74) *Attorney, Agent, or Firm* — Hackler Daghighian Martino & Novak

(57) ABSTRACT

An illuminated display includes a plurality of illumination means, in particular a plurality of LEDs, which are arranged on a transparent base member. The transparent base member reduces visible light on average by a maximum of 40%. Preferably, the transparent base member is constructed in the form of a film, or in a further preferred manner in the form of a plastics material film. The illumination means are supplied with voltage by means of strip conductors. The strip conductors are electrically connected at one end preferably to a control unit and at the other end to at least one illumination means.

17 Claims, 10 Drawing Sheets

(51) Int. Cl.
  *H05K 1/18*    (2006.01)
  *H05K 3/34*    (2006.01)
  *H05K 3/00*    (2006.01)

(52) U.S. Cl.
  CPC ........... *H05K 2201/0158* (2013.01); *H05K 2201/0979* (2013.01); *H05K 2201/09781* (2013.01); *H05K 2201/10098* (2013.01); *H05K 2201/10106* (2013.01); *H05K 2201/10121* (2013.01); *H05K 2201/10128* (2013.01); *H05K 2201/10151* (2013.01); *H05K 2201/10174* (2013.01); *H05K 2201/10522* (2013.01); *H05K 2203/0143* (2013.01); *H05K 2203/1545* (2013.01)

(56) References Cited

U.S. PATENT DOCUMENTS

| | | |
|---|---|---|
| 2001/0022589 A1 | 9/2001 | Tokimoto et al. |
| 2005/0201087 A1* | 9/2005 | Ward ................. F21S 2/00 362/223 |
| 2007/0176854 A1 | 8/2007 | Ward et al. |
| 2007/0182666 A1 | 8/2007 | Hochman et al. |
| 2007/0218751 A1 | 9/2007 | Ward |
| 2009/0146918 A1 | 6/2009 | Kline et al. |
| 2011/0070461 A1* | 3/2011 | Yamada ............. C21D 6/002 428/687 |
| 2011/0085321 A1 | 4/2011 | Eli |
| 2014/0133137 A1* | 5/2014 | Kiss ................. H05B 45/20 362/145 |
| 2014/0253414 A1 | 9/2014 | Byrd |
| 2014/0254111 A1* | 9/2014 | Yamazaki .......... H01L 27/3276 361/749 |
| 2015/0186099 A1 | 7/2015 | Hall |
| 2015/0210588 A1* | 7/2015 | Chang ............... C03C 21/002 361/750 |
| 2015/0235609 A1 | 8/2015 | Hall |
| 2015/0382446 A1* | 12/2015 | Kwon ................. H05K 1/028 174/251 |
| 2016/0019831 A1* | 1/2016 | Hall .................. G09G 3/3208 345/212 |
| 2016/0035924 A1* | 2/2016 | Oraw ................ H01L 31/0508 136/244 |
| 2016/0154170 A1* | 6/2016 | Thompson ........ G02F 1/133603 362/609 |
| 2017/0047393 A1* | 2/2017 | Bower ................ G06F 3/044 |

FOREIGN PATENT DOCUMENTS

| | | |
|---|---|---|
| CN | 103975377 A | 8/2014 |
| DE | 10 2008 009 775 A1 | 1/2009 |
| DE | 20 2008 017 988 U1 | 2/2011 |
| DE | 10 2010 012 064 A1 | 9/2011 |
| EP | 2 400 822 A2 | 12/2011 |
| WO | 2007/087376 A1 | 8/2007 |

* cited by examiner

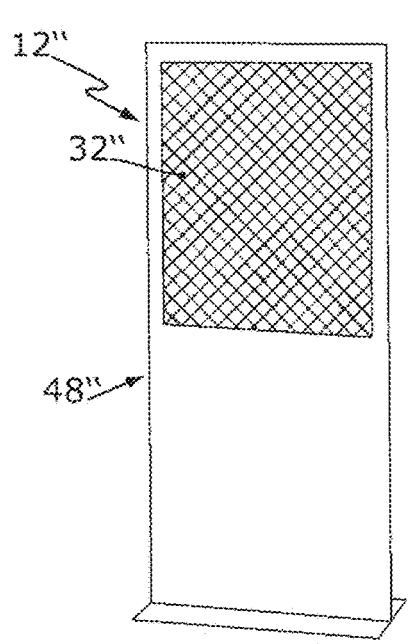
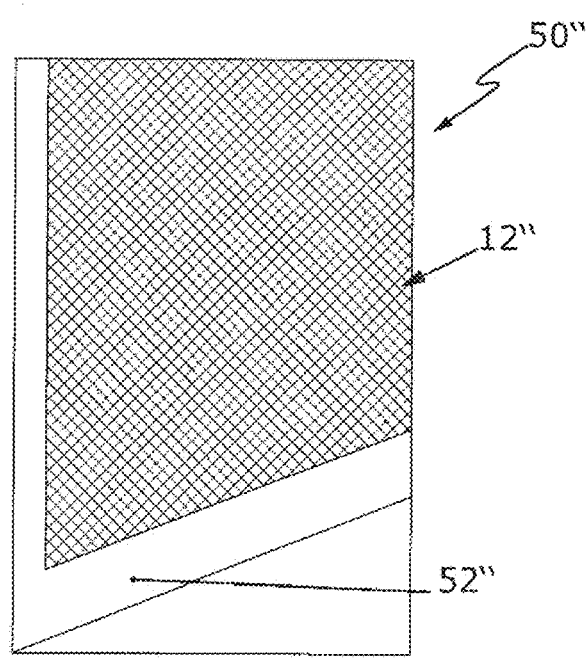
Fig. 11   Fig. 12
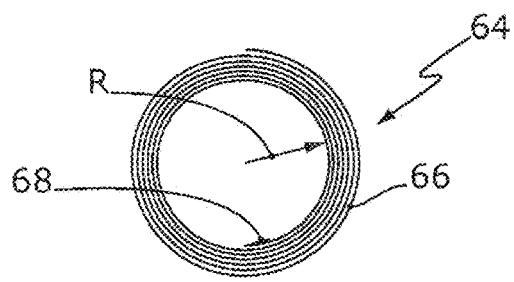
Fig. 13
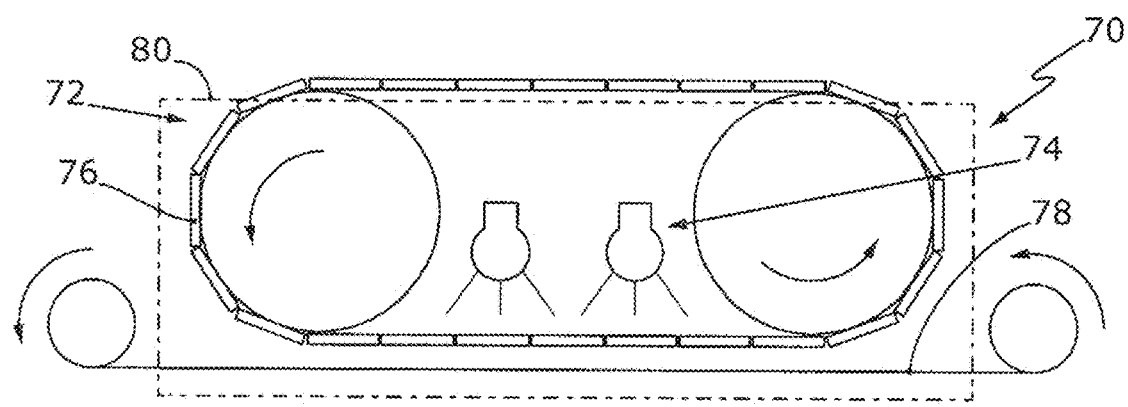
Fig. 14a
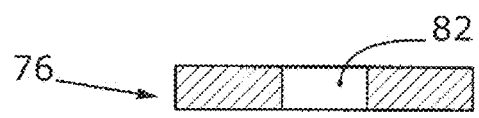
Fig. 14b

ILLUMINATED DISPLAY

CROSS-REFERENCE TO RELATED APPLICATIONS

This continuation application claims priority to PCT/EP2016/072994 filed on Sep. 27, 2016 which has published as WO 2017/055279 A1 and also the German application number 10 2015 218 610.5 filed on Sep. 28, 2015, the German application number 20 2016 102 308.4 filed on Apr. 29, 2016, and the German application number 20 2016 103 036.6 filed on Jun. 8, 2016, the entire contents of which are fully incorporated herein with these references.

DESCRIPTION

Field of the Invention

The invention relates to an illuminated display for displaying an image or film. The invention further relates to a method for controlling an illuminated display and a method for producing an illuminated display.

Background of the Invention

It is known to use illuminated displays with a large number of illumination means for advertising purposes. For example, EP 2 400 822 B1 disclosed a generic illuminated display in which a plurality of illumination means are arranged on a base member.

The present invention is accordingly intended, even with the illumination means switched off, to enable an illuminated display which is optically attractive but which can be produced in a cost-effective manner to be provided.

SUMMARY OF THE INVENTION

This object is achieved according to the invention with an illuminated display having the features of the independent patent claims, including a method for producing such an illuminated display and a method for operating an illuminated display. The dependent patent claims set out preferred developments.

The base member consequently reduces per se visible light by a maximum of 40%, is thus extremely substantially transparent. A viewer of the illuminated display according to the invention can thereby see through the illuminated display when the illumination means are switched off. The illuminated display according to the invention may thereby, for example, be assembled on a front pane of a building so that a viewer can see inside the building when the illumination means are switched off and, when at least some illumination means are switched on, perceives primarily the illuminated display. Alternatively or additionally, the illuminated display has at least three illumination means which are spaced widely apart from each other in a face. The planar base member extends in the main plane of the base member.

Preferably, the base member is optically so transparent that it reduces visible light by a maximum of 30%, in particular by a maximum of 20%, more preferably by a maximum of 10%.

The strip conductors for electrical supply of the illumination means may at least constitute a portion of a cover of the base member. The cover preferably comprises a large number of structures. In this case, the structures are per se extremely substantially impermeable to visible light. That is to say, the cover or the individual structures of the cover reduce(s) visible light by at least 80%. The cover assists the illuminated display towards a largely uniform mean optical permeability. To this end, the structures of the cover cover the base member by from 30% to 60%. The value of from 30% to 60% is measured in this instance in a 1 $cm^2$ large square positioned anywhere in the main plane of the base member. In 85% of cases, the square may be positioned in the main plane of the base member in such a manner that the structures cover from 30% to 60% of the base member.

The mean optical permeability, that is to say, the transparency for visible light, is preferably reduced by the cover in 85% of cases in a 1 $cm^2$ large square of the strip conductor arrangement by a maximum of from 50% to 70%. The 1 $cm^2$ large square can in this instance be freely determined in the main plane of the strip conductor arrangement. The cover has a plurality of structures, wherein the individual structures of the cover reduce the optical permeability by at least 80%. The individual structures of the cover can thereby no longer be distinguished by the human eye at a distance of more than 5 m, whereby the illuminated display has a uniform optical transparency.

The structures of the cover may have different geometries. The cover may further have a colour for light absorption. In a particularly preferred manner, the cover is constructed in the form of a metal coating or metal coating structures.

Preferably, the cover has primarily strip conductors. As a result of the cover, the mean optical permeability of the entire strip conductor arrangement is preferably reduced by a maximum of 70%, in particular by a maximum of 60%, more preferably by a maximum of 50%.

In a particularly preferred embodiment of the invention, at least 60% of the strip conductor portions of the strip conductors have the same spacing with respect to the nearest strip conductor portion thereof and the same width as the nearest strip conductor portion thereof. A particularly uniform transparency of the strip conductor arrangement in the main plane of the base member or the strip conductor arrangement can thereby be achieved.

In a further preferred manner, at least 80% of the strip conductor portions have the same spacing with respect to their nearest strip conductor portion and the same width as their nearest strip conductor portion.

In order to obtain the most uniform possible optical appearance, the strip conductor arrangement may have a plurality of strip conductor portions which are redundant or functionless for connecting the illumination means.

The strip conductors may be constructed from a metal, in particular from gold, silver and/or aluminium. Preferably, the strip conductors are constructed from copper. In contrast to transparent conductors, for example, of indium tin oxide (ITO), copper has a very high electrical conductivity. The strip conductors preferably have a thickness between 5 μm and 35 μm perpendicularly to the main plane of the base member. The strip conductors may be connected to the base member by means of at least one intermediate layer, that is to say, at least indirectly. Preferably, the strip conductors are arranged directly on the base member so that the production of the illuminated display is significantly simplified.

The illumination means are preferably arranged in the form of a matrix—directly or indirectly—on the strip conductor arrangement. The strip conductors of a first electrical voltage pole, that is to say, the plus pole or the minus pole, for the illumination means are preferably arranged primarily at a first side of the main plane of the base member and the strip conductors of a second electrical voltage pole for the illumination means are preferably arranged primarily at the second side of the main plane of the base member, wherein the second side is opposite the first side.

Since the strip conductors are thereby located in different planes, the strip conductors can cross in a collision-free manner. In order to be able to arrange the illumination means only at the first side of the main plane of the base member, the base member may have at least one through-contacting from the first side to the second side. A through-contacting of the base member is preferably provided in the region of the plurality of illumination means.

The strip conductors of the first electrical voltage pole are preferably electrically connected in rows and the strip conductors of the second electrical voltage pole are preferably electrically connected in columns. The illuminated display may thereby be constructed in a structurally particularly simple manner.

The plurality of illumination means are preferably arranged at least indirectly on the base member in such a manner that the main radiation direction of the illumination means is directed into the base member. The illumination means are consequently applied in the flip chip method so that the side of the base member opposite the illumination means is constructed in a planar manner and can thereby be applied in a planar manner to an object. The illuminated display can thereby be assembled on a glass pane, in particular in a bubble-free manner.

In a particularly preferred embodiment of the invention, the base member is constructed in the form of a film. The illuminated display can thereby be applied in a flexible manner to facades, window panes or the like. The film is preferably constructed in the form of a plastics material film, in particular in the form of a PET film (polyethylene terephthalate film). A film is intended to be understood to be an independent, thin, in particular insulating, sheet having a thickness of less than 3 mm, in particular less than 1 mm. Strip conductors for electrical connection of the illumination means are preferably etched from a metal layer which is deposited on the film. The base member may in a further preferred manner be constructed in the form of an adhesive film. Alternatively, the base member may be constructed in the form of an adhesive film. The strip conductor arrangement can thereby be applied to a planar surface and removed again several times without residue.

The strip conductor arrangement and the illumination means may be provided at least partially with a protective coating, that is to say, a coating, for external use.

The base member may be constructed to be extremely substantially light-impermeable. Alternatively or additionally, the base member may be printed.

A particularly compact, robust and energy-saving light indicator is achieved when the plurality of illumination means have light emitting diodes (LEDs). The LEDs may be constructed in the form of organic LEDs. Preferably, all illumination means have LEDs. The majority of the illumination means, in particular all the illumination means, have in a further preferred manner RGB LEDs.

In contrast to large screen televisions, the illumination means preferably have a spacing with respect to each other of more than 30 mm, in particular more than 40 mm, in a particularly preferred manner more than 50 mm. The optical transparency of the illuminated display thereby remains ensured.

In addition to the illumination means, the illuminated display may have at least one sensor, in particular a light sensor, preferably in the form of a photodiode. The illuminated display may thereby react, for example, to incident sunlight and accordingly adapt the illumination strength of the illumination means.

The illuminated display may have a control unit for controlling the illumination means. The control unit is preferably arranged on the base member. The control unit may have an illumination means driver and a microcontroller control for receiving and decoding image data or film data on the basis of which the illumination means can be controlled. The control unit may have a printed circuit board, which by means of a joining method is arranged on the strip conductor arrangement, in particular soldered or riveted to the strip conductor arrangement. Preferably, the printed circuit board is adhesively bonded or laser spot soldered to the strip conductor arrangement.

With respect to the main plane of the strip conductor arrangement, the control unit is preferably mounted at the same side of the strip conductor arrangement as the illumination means and/or the at least one sensor. The provision of the strip conductor arrangement with structural elements can thereby be carried out exclusively from one side of the main plane of the base member, whereby the production of the illuminated display can be carried out in a significantly more cost-effective manner.

The control unit may be arranged in an edge region of the illuminated display so that the region of the illuminated display can be folded away, in particular in order to further process the region which is not folded away, for example, to print and/or to shape it. Furthermore, the power supply of the illumination means can be carried out with an electrically parallel connection method from the control unit so that a portion of the illuminated display spaced apart from the control unit can be removed from the control unit without impairing the functionality of the illumination means remaining on the illuminated display. The removal of a portion of the illuminated display may be carried out in a particularly flexible manner if the control unit is arranged in a corner region of the illuminated display. Particularly large portions of the illuminated display remote from the corner region can thereby be removed without impairing the functionality of the illumination means remaining on the illuminated display.

The illumination means are in this instance preferably arranged in the form of a horizontally or vertically extending matrix, wherein the illuminated display is constructed in such a manner that, by means of a continuous horizontal cut and/or a continuous vertical cut of the strip conductor arrangement, the portion of the strip conductor arrangement which remains with the corner region retains its functionality. In a further preferred manner, the illuminated display may be constructed in such a manner that, by means of a continuous circle-portion-like cut which is radial from the corner region, the portion of the strip conductor arrangement which remains with the corner region retains its functionality. The removability of large portions of the illuminated display is in particular produced when the strip conductor portions of the strip conductors which lead directly from the control unit to the illumination means lead away from the control unit by at least 80%, in particular by at least 90%.

The base member may have at least one through-recess, in particular a plurality of through-recesses, in order to construct the illuminated display in a lighter manner and to be able to secure it to an object in a bubble-free manner.

In another preferred embodiment of the illuminated display, the illuminated display is composed of a plurality of segments. The illuminated display has in this instance a plurality of identical segments each comprising a control unit, illumination means and a strip conductor arrangement, wherein the illuminated display has a control device for controlling a plurality of control units. The illuminated display can thereby at the same time be constructed in a cost-effective manner and so as to cover large surfaces. Preferably, a plurality of segments, in particular all segments—with the exception of any trimmings of the segments—are constructed in an identical manner. The base member of at least some segments are preferably connected to each other, in a further preferred manner constructed integrally with each other. The segments preferably have a length between 10 cm and 100 cm, wherein the length of the segments is determined in the direction of mutually adjacent segments.

The voltage supply of the control units of the respective segments is preferably carried out by means of an electrical parallel circuit. In a further preferred manner, each control unit has a DC voltage converter which is constructed to reduce the voltage applied to the control units. It is thereby also possible for segments which are widely spaced apart to be reliably supplied with a sufficiently high level of voltage. In this instance, the segments are supplied with a high voltage which is reduced at the respective control units. The DC voltage converters are in a further preferred manner constructed to stabilise the voltage output by the control units.

The control units may be constructed in an identical manner in order to structurally simplify the illuminated display. The control units are preferably constructed for communication with each other. The controls units are preferably constructed in such a manner that during a first electrical contact of the control units with each other a first control unit is defined as a master and the additional control units are each defined as slaves, wherein the master unit is constructed for communication with the control unit. Preferably, the control units are constructed in such a manner that there is defined as master a first control unit which has only a single control unit as a nearest neighbour.

The segments are preferably constructed to output a distortion-free image or film if—as described above—one or more components of a segment or a plurality of segments have been removed.

At least one control unit and/or at least one control device may have a radio receiver, in particular in the form of a WLAN radio receiver, for direct control of the illumination means and/or for programming the control unit or the control device. The radio receiver enables an installation of the illuminated display at poorly accessible locations, for example, in the region of a glass facade, but with the controllability of the illuminated display nonetheless being maintained.

The illuminated display can be particularly comfortably mounted and installed on any object when the control device is constructed using the illumination means to output a test image and/or a test film, wherein the control device is further constructed to derive information from the recorded test image and/or test film relating to the position of the segments. The position of the segments thereby does not have to be determined before the installation of the illuminated display on the object, but instead can be comfortably determined after the installation.

Preferably, the control device has an interface, in particular a DVI interface, an HDMI interface, a USB interface or a LAN interface, for importing image data and/or film data.

The segments may each have a flexible base member. In a further preferred manner, the base members are constructed in such a flexible manner and the control units are constructed in such a small manner that the segments have a minimum bending radius of less than 50 mm, in particular less than 30 mm, preferably less than 20 mm.

LED strips in the prior art generally have a base member which is not plastically deformable. In contrast, according to the invention a base member of a thermoplastic plastics material is preferably provided in order to be able to permanently deform the illuminated display. The further processing of the illuminated display may in this instance also involve an in-mould decoration and/or an insert moulding.

The illuminated display may have a non-movable object on which the base member, the strip conductor arrangement and the illumination means are arranged. The non-movable, that is to say, immobile object is in particular an object for which planning permission is required.

The illuminated display may have a facade, in particular a glass facade, an advertising board, a roof rail and/or a sign. The non-movable object comprises in a further preferred manner a light advertising element, in particular a pylon, a fascia and/or a facade banner, on which the strip conductor arrangement is arranged. The illuminated display according to the invention has in a particularly preferred manner a corporate design element, in particular a garage, a petrol station, a restaurant, a bank, an insurance company or a department store.

As a result of the spacing of at least 10 mm of the illumination means from each other, the illuminated display is constructed for viewing from a specific distance. In order to select the viewing distance of the illuminated display so as not to be too large, the illumination means are preferably arranged at a spacing of a maximum of 120 mm, in particular a maximum of 90 mm, preferably a maximum of 60 mm with respect to each other.

Preferably, the illumination means are in the first direction spaced apart from each other by the same extent and/or are in the second direction spaced apart from each other by the same extent. The illumination means may be spaced apart from each other in the second direction by the same extent as in the first direction.

The illumination means can be switched on and off together. Preferably, each of the three above-mentioned illumination means, in particular the majority of all the illumination means of the illuminated display, preferably all the illumination means of the illuminated display, can be controlled individually. The illuminated display can thereby be used to display different images.

In a further preferred manner, the columns of the matrix comprising illumination means are arranged at a right angle relative to the rows thereof.

The illumination means may be arranged between the film and a plate. The plate may have at least one recess in order in the region of the recess to have increased transparency for the light of an illumination means. There may be arranged on the plate a poster or the like whose optical effect is modified by the illumination means, in particular in the region of the recess. Preferably, the plate has a large number of recesses which are each associated with an illumination means. Preferably, the recesses are in alignment with the illumination means which are associated therewith. At least one recess, in particular a plurality of recesses, may be constructed in the form of a through-recess. Little light of the illumination means is thereby absorbed by the plate.

Alternatively or additionally, the illuminated display may have two at least partially transparent plates which reduce visible light by a maximum of 70%, in particular a maximum of 40%, preferably by a maximum of 10%. The transparent plates are in particular constructed in the form of glass panes. The film extends in this instance in particular substantially parallel with the plates.

In another embodiment of the invention, the illuminated display has a panoramic roof. The panoramic roof is in this instance in particular constructed in the form of a panoramic roof for a motor vehicle. The illuminated display may be arranged on the panoramic roof. The illuminated display may preferably be used to display a starry sky, wherein the illumination means represent different stars.

At least one LED of the illuminated display may be constructed in the form of a high-power LED. The high-power LED may have an illumination power of at least 60 lm/watt, in particular of at least 80 lm/watt, preferably of at least 100 lm/watt. Such a high-power LED may in particular be used as a reading light, preferably in an illuminated display for a panoramic roof. If the illuminated display according to the invention has a panoramic roof and an illuminated display having a high-power LED, a plurality of illumination means can be used as ambient lighting and at least one illumination means with a high-power LED, in particular a plurality of individual illumination means with a high-power LED, can be used as reading light(s).

In another preferred embodiment of the invention, the illuminated display has a flying device. The flying device may be constructed in the form of an airship. The light indicator is in this instance arranged indirectly or directly on the flying device. The flying device can thereby be used as a large advertisement carrier, whose outer side is at least partially optically modified by the illuminated display.

The illuminated display may have a cam carpet. A cam carpet is intended to be understood according to the invention to be a substantially flat extension arm which, in particular in stadiums, can be laid flat on a floor and with a perpendicular plan view shows a distorted image. The distorted image appears undistorted for a viewer from a single perspective. A cam carpet can be used in particular during football games, wherein the undistorted view is produced when viewing from a specific camera perspective. The distortion of the image displayed in the normal perspective may exclusively be achieved by a distorted display using illumination means which are arranged in a non-distorted manner. Alternatively or additionally, the illumination means may be arranged on the film in a distorted manner. The illuminated display may have the camera, from the perspective of which the image reproduced by the illuminated display appears in an optically undistorted state.

The illuminated display may have a cover having a pattern which superimposes a plurality of illumination means of the illuminated display. By controlling the illumination means, the appearance of the illuminated display which is composed of the light of the illumination means and the pattern can be changed for a viewer of the illuminated display. In the switched-off state of the illuminated display, practically only the pattern of the cover is consequently visible to the viewer whilst the pattern can be changed or superimposed by the illumination means. The illuminated display according to the invention can therefore be used both in the switched-off state and in the switched-on state as an advertisement carrier or as an information carrier. The illuminated display can consequently be used as a particularly energy-saving advertisement carrier. Furthermore, the illuminated display may be used as a particularly safe information system, for example, for escape routes, which also functions in the switched-off state, for example, in the event of a power failure. The illuminated display may in this instance also be described as an "augmented poster".

Preferably, the illuminated display is constructed to outshine the pattern during darkness by the switched-on illumination means so that the pattern is dominated by the light of the illumination means. Whilst during daylight the appearance of the illuminated display is dominated primarily by the pattern which can optionally be modified by the illumination means, during night-time or darkness the appearance is primarily determined by the light of the illumination means. The cover preferably conceals the majority of the illumination means of the illuminated display, in particular all the illumination means of the illuminated display.

In a particularly preferred manner, the pattern of the cover is formed by a printed region of the cover. The static cover may thereby be produced in a particularly simple manner and consequently replaced in a cost-effective manner. The pattern of the cover may be formed at least partially in the form of fluorescent colour for converting UV light into visible light. The fluorescent colour is in this instance preferably printed on the cover. The portions of the pattern which are constructed with fluorescent colour thereby become visible when irradiated with UV light.

At least one illumination means of the illuminated display, in particular a plurality of illumination means of the illuminated display, may have a UV light source. The UV light source is preferably constructed in the form of an LED. In a particularly preferred manner, in this instance at least portions of the pattern are constructed in the form of fluorescent colour so that these portions of the pattern only become visible when the UV light source is switched on.

In another preferred embodiment of the invention, the cover has a fabric, in particular a printed fabric. The fabric may be constructed in the form of a plastics material fabric. The fabric may be constructed in the form of a canvas. In a particularly preferred manner, the fabric is constructed in the form of a nylon fabric. Such a fabric is, on the one hand, ideal for printing with a pattern and, on the other hand, sufficiently transparent to transmit the light of the illumination means.

The illuminated display may have a routing system. The routing system may be constructed to direct a visitor in a building by means of a light marking to a specific room. For example, during access to a building, the name of the person to be visited can be given, to which name a colour is allocated. A light marking in this colour then leads to the room of this person to be visited. After a predetermined time, the colour marking goes out again and can be allocated to another person to be visited.

The illuminated display may have a stele for internal and/or external use. Such steles—without being covered with a pattern—are widely used in public areas, for example, railway stations or airports. The stele may have a first segment and a second segment opposite the first segment. Only the first segment may be at least partially covered by a cover with a pattern. Alternatively or additionally, the second segment may be at least partially covered with a cover having a pattern. Preferably, both segments are at least partially covered by a common cover. The common cover may be constructed in the form of a hood which is placed over the stele.

The illuminated display can be produced in a particularly extensive and cost-effective manner if the base carrier is processed from roller to roller. The provision with illumination means and/or the control units is preferably carried out only from one side of the base member in this case. The strip conductors are preferably separated in a galvanic manner. In order to increase the ability of the rollers to be processed, the rollers preferably have a width between 30 cm and 90 cm, preferably a width between 50 cm and 70 cm, and a length of more than 100 m. The illuminated display is in this instance preferably composed by a plurality of paths which are produced from roller to roller. This enables a construction of the illuminated display with a surface having the size of a tennis court.

At least one illumination means and/or at least one sensor may be arranged in this production method by means of a joining method on the strip conductor arrangement, in particular welded or riveted to the strip conductor arrangement.

Preferably, at least one illumination means and/or at least one sensor is/are adhesively bonded or laser spot welded to the strip conductor arrangement. The joining methods adhesive bonding and laser spot welding can in this instance also be used with base members which have a low melting point, in particular below 200° C.

The method for producing the illuminated display preferably comprises thermal radiation of the base member by means of an endless chain of a reflow oven which is provided with through-recesses. The endless chain acts in this instance as a heat shield for the heat-sensitive base member.

Alternatively or additionally, the production of the illuminated display may comprise a thermal deformation. In this instance, at least portions of the illuminated display may be curved between two heated moulded components. The deformation may involve a vacuum deformation. The method for producing the illuminated display may involve an in-mould decoration method and/or an insert moulding.

The invention further comprises a method for controlling an illuminated display described above with the method steps:
A) transmitting a test image or a test film using illumination means controlled by the control device;
B) recording the test image/test film;
C) playing the test image/test film in the control device;
D) associating the position of the segments by means of the played test image/test film using the control device;
E) outputting an image or film using the illumination means controlled by the control device on the basis of the association according to method step D).

The method enables the automatic association of individual segments of the illuminated display after they have been installed on an object. The recording of the test image or test film can be carried out by means of a camera of a mobile telephone or tablet.

The control device may have a piece of software which is constructed to carry out a correcting perspective distortion of the image or film output by the illumination means. In a further preferred manner, the control device is constructed to establish a perspective distortion of a recorded object. The control device may thereby compensate for a perspective distortion which is produced, for example, by an illuminated display being installed "diagonally". In this instance, the perspective distortion is first established by means of the image or film output by the illumination means and subsequently such a distorted image is output via the illumination means so that the established distortion is largely compensated for.

The illuminated display may further have a correction device which is constructed to compensate for a displacement or distortion of the cover by the illumination means being controlled in a correcting manner by the correction device or the control device. A correction device of the illuminated display may be constructed to correct the individual shading of a plurality of illumination means by the pattern by means of an adapted actuation of a plurality of illumination means. That is to say, in this instance the correction device is constructed to adapt the illumination intensity of a plurality of illumination means to the pattern of the cover. The correction device may have a camera for recording a photo and/or video in order to control the illumination means using the recorded photo or video in an adapted manner. Alternatively or additionally, the correction device may be constructed to control the actuation of a plurality of illumination means of the illuminated display taking into account a mathematical model which is stored in the correction device. The transparency of a plurality of pattern portions of the cover may be stored in the mathematical model.

The invention further comprises a method for operating an illuminated display, in particular an illuminated display described above, in which illumination means which are arranged in the form of a matrix are controlled in rows with a duration between 100 ms and 1 s. A row is intended in this instance to be understood to be a column or a row of the matrix. Alternatively or additionally, a single row/several rows can be jumped when the illumination means are controlled in rows. The overall power consumed by the light indicator is thereby consumed primarily in predetermined regions of the illuminated display so that these regions are illuminated particularly brightly. This enables increased actuation of the predetermined regions during daylight without increasing the overall current consumed by the illuminated display.

Other features and advantages of the invention will be appreciated from the following detailed description of an embodiment of the invention, the patent claims and with reference to the Figures of the drawings which show details which are significant to the invention. The features shown in the drawings are illustrated in such a manner that the specific features according to the invention can be made clearly visible. The different features may be implemented individually per se or together in any combinations in variants of the invention.

BRIEF DESCRIPTION OF THE DRAWINGS

In the drawings:

FIG. 2b is a cut-out from the strip conductor arrangement according to FIG. 2a;

FIG. 8c is a plan view of the illuminated display according to FIG. 8b with other illumination means which are switched on;

FIG. 11 is an illuminated display with a stele;

FIG. 12 is a perspective view of a corridor of a building with an illuminated display in the form of a routing system;

FIG. 13 is a plan view of a segment of a curved light indicator;

FIG. 14a is a schematic side view of a device for producing a portion of an illuminated display; and FIG. 14b is a sectioned view of a chain segment of the device from FIG. 14a.

DETAILED DESCRIPTION OF THE PREFERRED EMBODIMENTS

Figure 1:
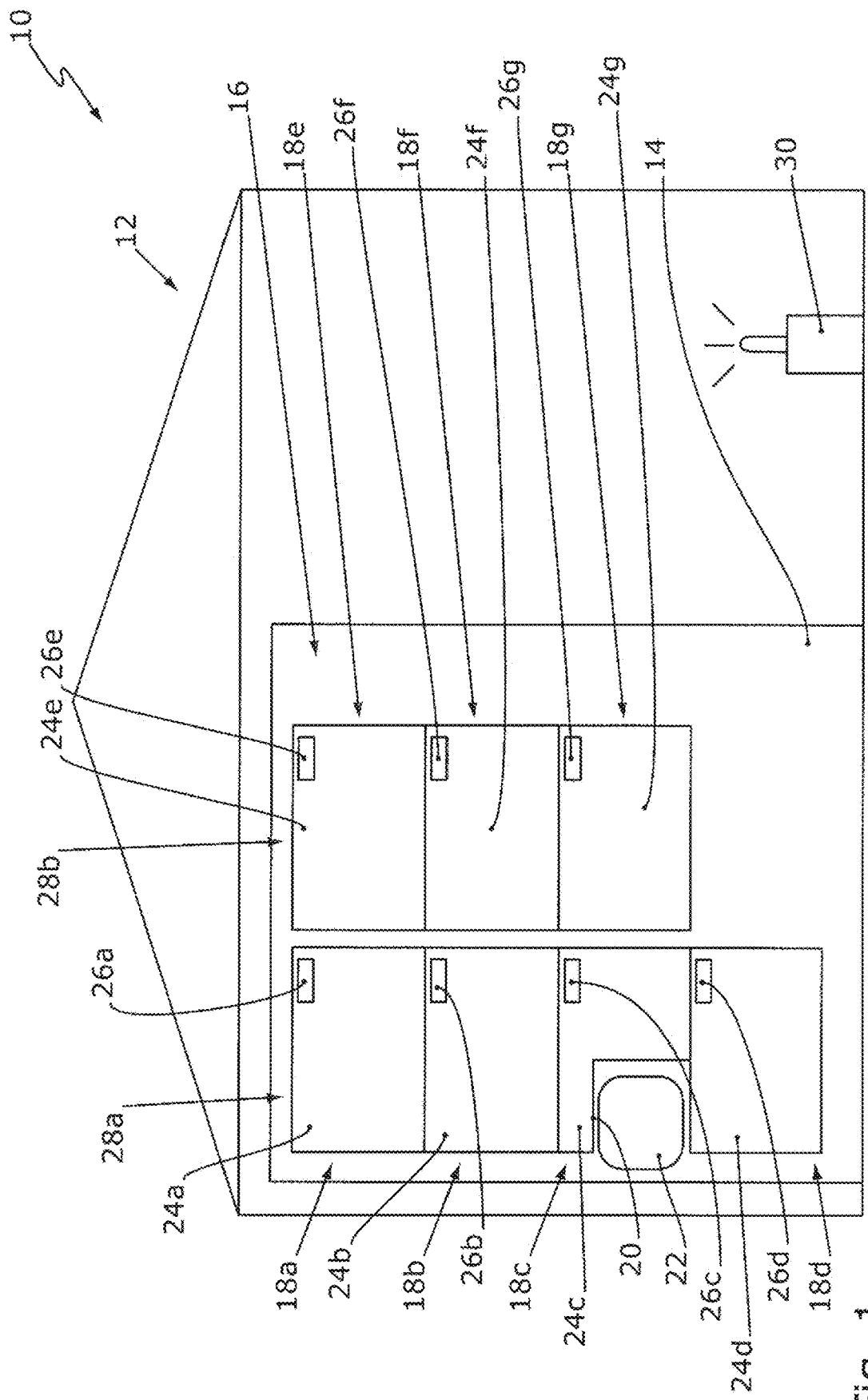
FIG. 1 is a schematic illustration of an illuminated display with a building and a plurality of segments which are arranged on the building and which each have a strip conductor arrangement.

FIG. 1 is a schematic view of an illuminated display 10. The illuminated display 10 has a building 12 with a glass facade 14. Furthermore, the illuminated display 10 has a segment arrangement 16 with a plurality of segments 18a-g. The segments 18a-g serve to display an image or a film on the glass facade 14. The segments 18a-g are in this instance constructed to be so transparent that an observer (not shown) located outside the building 12 can still see through the glass facade 14. Parts of the segments 18a-g can be removed without the functionality of the remaining portions of the segments 18a-g being impaired. This is indicated in FIG. 1 by way of example in the case of the segment 18c which in contrast to the additional segments 18a-b and 18d-g has a trim 20 in order to provide space for a carrier 22 of the building 12. The segments 18a-g are—with the exception of the trim 20—constructed in an identical manner.

The segments 18a-g each have a strip conductor arrangement 24a-g on which a control unit 26a-g is arranged in each case. The control units 26a-g control the illumination means (not shown) of the segments 18a-g. The segments 18a-d and the segments 18e-g each have strip conductor arrangements 24a-d or 24e-g which are electrically connected to each other. The strip conductor arrangements 24a-d or 24e-g each have in this instance a common base member (not provided with a reference numeral in FIG. 1). The segments 18a-d and the segments 18e-g thereby form a segment path 28a, 28b, respectively.

As soon as the segment paths 28a, 28b are provided with electrical voltage, the control units 26a-d or 26e-g each determine a master control unit. Preferably, the illuminated display 10 is constructed in such a manner that there is determined a control unit for the master control unit whose strip conductor arrangement has only one other strip conductor arrangement which is directly connected thereto. In the example shown in FIG. 1, the control units 26a and 26e could be determined to be master units. The remaining control units 26b-d or 26f-g are determined to be slave control units which are dependent on the master control units 26a or 26e, respectively. The control units 26a-d and 26e-g of the segment paths 28a, 28b each form a daisy chain.

Only the master control units 26a, 26e communicate with a control device 30 of the illuminated display 10. The control device 30 is in the present instance constructed for wireless communication with the master control units 26a-26e. Alternatively or additionally, the control device 30 may be constructed via a cable connection (not shown) for communication with the control devices 26a, 26e.

Figure 2A:
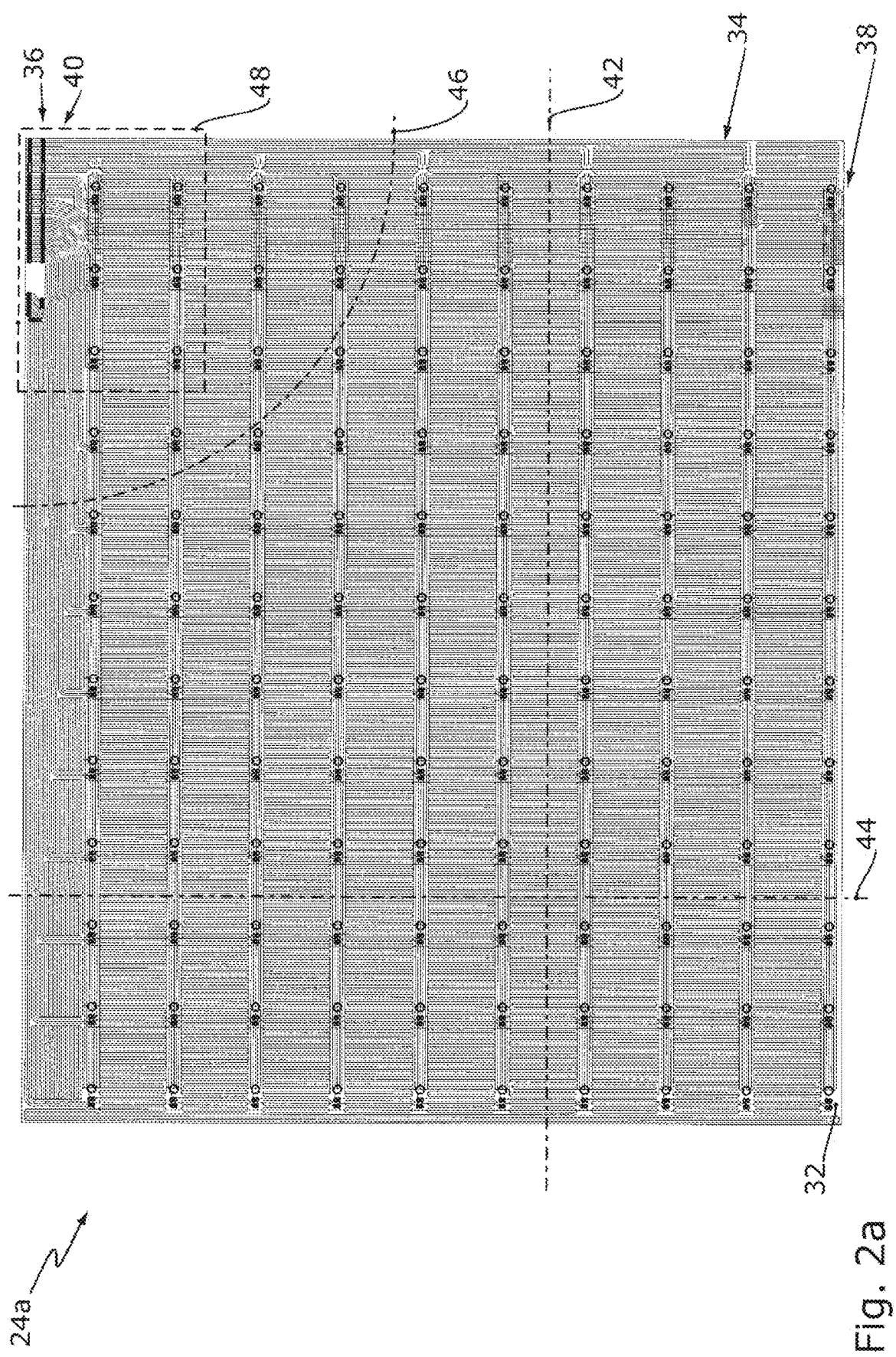
FIG. 2a is a plan view of a strip conductor arrangement of a segment.

FIG. 2a shows the strip conductor arrangement 24a. The strip conductor arrangement 24a has a base member 32 which is constructed in the form of a flexible plastics material film. A large number of strip conductors 34 are arranged on the base member 32. The strip conductors 34 are constructed from copper. The voltage supply of the strip conductor arrangement 24a is carried out via an input 36. Another strip conductor arrangement can be electrically connected to an output 38 of the strip conductor arrangement 24a, in this instance the strip conductor arrangement 24b (see FIG. 1).

The control unit 26a (see FIG. 1) can be arranged in the region of the input 36. The input 36 is constructed in a corner region 40 of the control unit 24a. It is thereby possible, by means of a continuous horizontal cut 42 and/or a continuous vertical cut 44 of the strip conductor arrangement 24a, for the portion of the strip conductor arrangement 24a remaining with the corner region 40 to maintain its functionality. Furthermore, by means of a radial, circle-portion-like continuous cut 46 from the corner region 40, it is possible for the portion of the strip conductor arrangement 24a remaining with the corner region 40 to maintain its functionality.

Figure 2B:
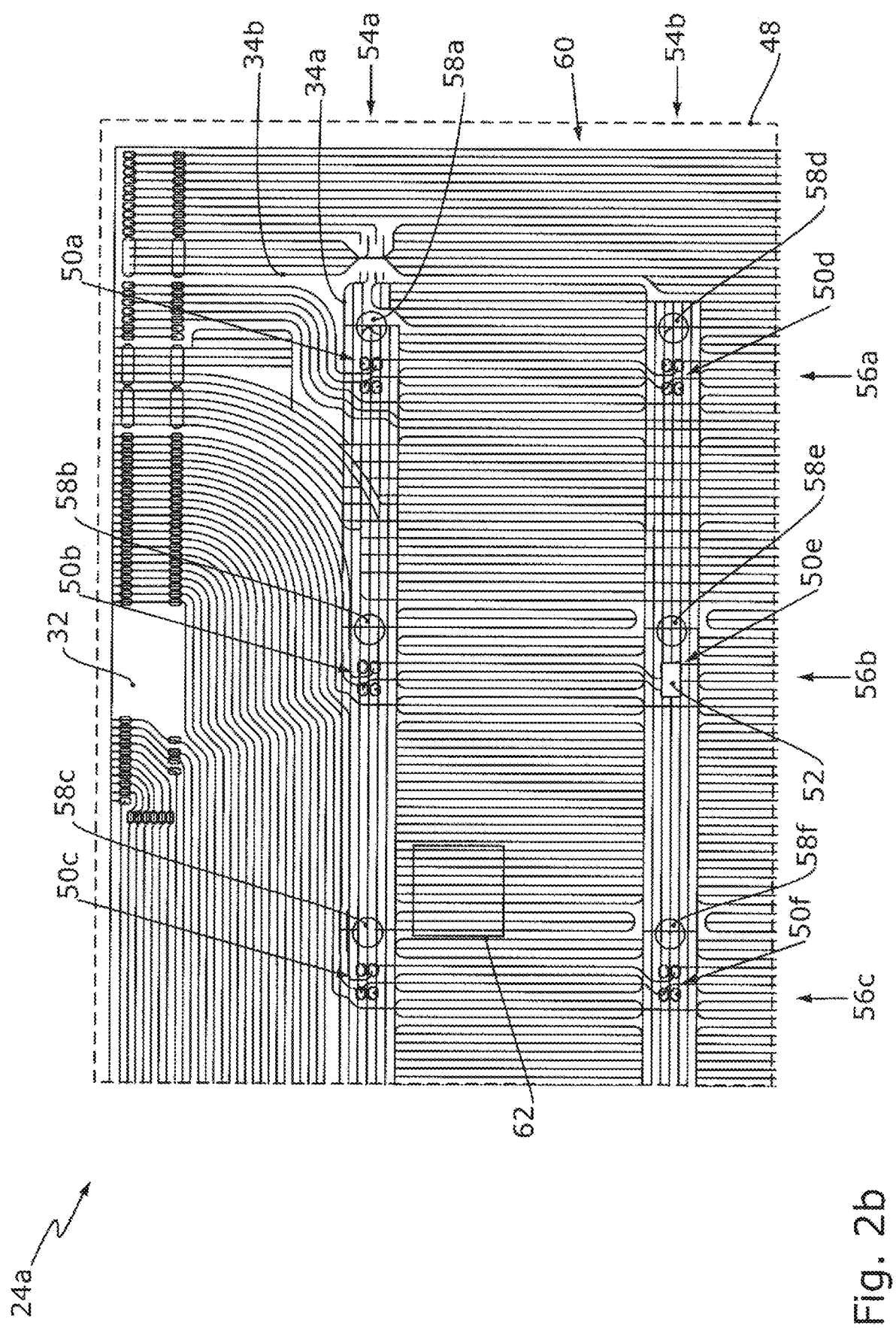

FIG. 2b shows a cut-out 48 (see also FIG. 2a) of the strip conductor arrangement 24a. With reference to the cut-out 48, it can be seen that the strip conductor arrangement 24a has a plurality of contact locations 50a-f for illumination means, in this instance for LEDs. In FIG. 2b, for example, an illumination means 52 in the form of an LED is arranged at the contact location 50e. The illumination means 52 may comprise an individual control board and/or a housing. The contact locations 50a-c or 50d-f are each arranged in horizontal rows 54a, 54b. Furthermore, the contact locations 50a, 50d or 50b, 50e or 50c, 50f are each arranged in vertical columns 56a-c. That is to say, the contact locations 50a-f are arranged in a horizontal/vertical matrix. The rows 54a, 54b are electrically connected by means of strip conductors, of which for reasons of clarity only one strip conductor 34a is provided with a reference numeral. The strip conductors of the rows 54a, 54b extend at the remote first side of the main plane of the base member 32 in FIG. 2b. The main plane of the base member 32 corresponds to the drawing plane of FIG. 2a and FIG. 2b.

There are arranged at the second side of the main plane of the base member 32, which side is facing the observer in FIG. 2b, the strip conductors of the columns 56a-c, of which in FIG. 2b only one strip conductor 34b is provided with a reference numeral.

In order to have to mount the illumination means, for example, the illumination means 52, only at one of the two sides of the main plane of the base member 32, apertures 58a-f are provided in the base member 32. The apertures 58a-f are constructed with a maximum of 10 mm spacing with respect to associated contact locations 50a-f in each case.

The strip conductors 34 constitute structures of a cover 60. As can be seen in FIG. 2b, the cover 60 has strip conductor portions which are redundant or superfluous for the power supply of the illumination means. A redundant power supply is also intended in this instance to be understood to be strip conductor portions which branch from a common strip conductor portion, extend in an electrically parallel manner and merge again, wherein the effective conductor cross-section of the strip conductor is increased at the strip conductor portions which extend in an electrically parallel manner. The cover 60 has in this instance a homogeneous average transparency, wherein the individual strip conductor portions can no longer be seen with the naked eye from a distance of at least 5 m.

In the main plane of the base member 32, theoretically 1 cm² large adjacent squares can be defined, of which in FIG. 2*b* a square 62 is provided with a reference numeral. In at least 85% of these squares, the surface-area of the strip conductors 34 in the main plane of the base member 32 covers the base member by from 30% to 60%. An optically particularly homogeneous impression of the strip conductor arrangement 24*a* is thereby given.

Figure 3:
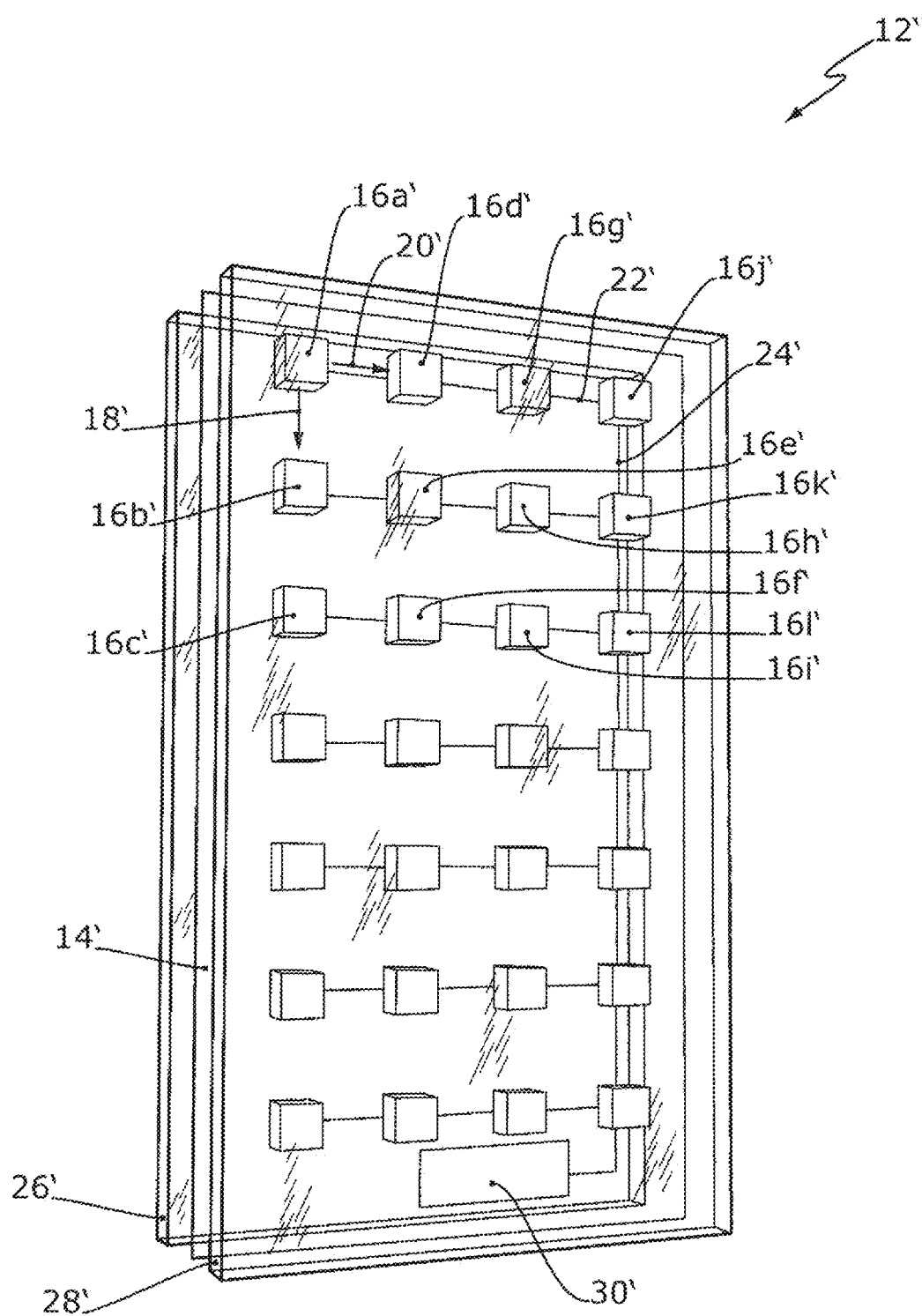
FIG. 3 is a perspective view of an illuminated display having two glass panes.

FIG. 3 shows an illuminated display 12'. The illuminated display 12' has a film 14' and a plurality of illumination means of which for reasons of clarity in FIG. 1 only the illumination means 16*a*'-16*l*' are provided with a reference numeral. The illumination means 16*a*'-16*l*' are arranged in the form of a matrix on the film 14'. The illumination means 16*a*'-16*l*' are in this instance arranged in columns and rows. For example, the illumination means 16*a*', 16*b*' and 16*c*' are arranged in a first direction 18' one behind the other in a column. The illumination means 16*a*', 16*d*', 16*g*', 16*j*' are arranged one behind the other in a second direction 20' in a row. The second direction 20' is in this instance perpendicular with respect to the first direction 18'. Furthermore, the illumination means 16*b*', 16*e*', 16*h*' and 16*k*' are arranged in another row. The illumination means 16*d*', 16*e*', 16*f*' are arranged in another column.

In order to be able to trim the illuminated display 12' or the film 14' thereof in a large region, the illumination means 16*a*'-16*l*' are connected to each other in rows. This is indicated in FIG. 1 by a first row 22' which is provided by way of example with a reference numeral. Furthermore, an illumination means 16*j*', 16*k*', 16*l*' of each row is connected to another illumination means 16*j*', 16*k*', 16*l*' of another row by a second line 24' which is provided by way of example with a reference numeral in FIG. 1. As an alternative to the embodiment shown, the illumination means 16*a*'-16*l*' of the columns may also be electrically connected to each other, wherein the individual columns are electrically connected to other columns. As a result of the above-described electrical connection between the illumination means 16*a*'-16*l*', individual illumination means can be removed without impairing the controllability of the remaining illumination means 16*a*'-16*l*'. In the illuminated display 12' according to FIG. 1, it is, for example, possible for the illumination means 16*b*'-16*c*' together with the film 14' in the region of the illumination means 16*b*', 16*c*' to be removed without impairing the controllability of the remaining illumination means 16*a*', 16*d*'-16*l*'.

The illuminated display 12' is arranged between two transparent plates 26', 28'. The transparent plates 26', 28' are constructed in the form of plastics material panes or glass panes. The plane of the film 14' extends parallel with the plane of the plates 26', 28'. Each illumination means 16*a*'-16*l*' can be individually controlled. The control of the illumination means 16*a*'-16*l*' is carried out by a control unit 30'. Each illumination means 16*a*'-16*l*' has an RGB LED. The film 14' is constructed in a completely transparent manner, wherein the film 14' reduces light by a maximum of 20%.

Figure 4:
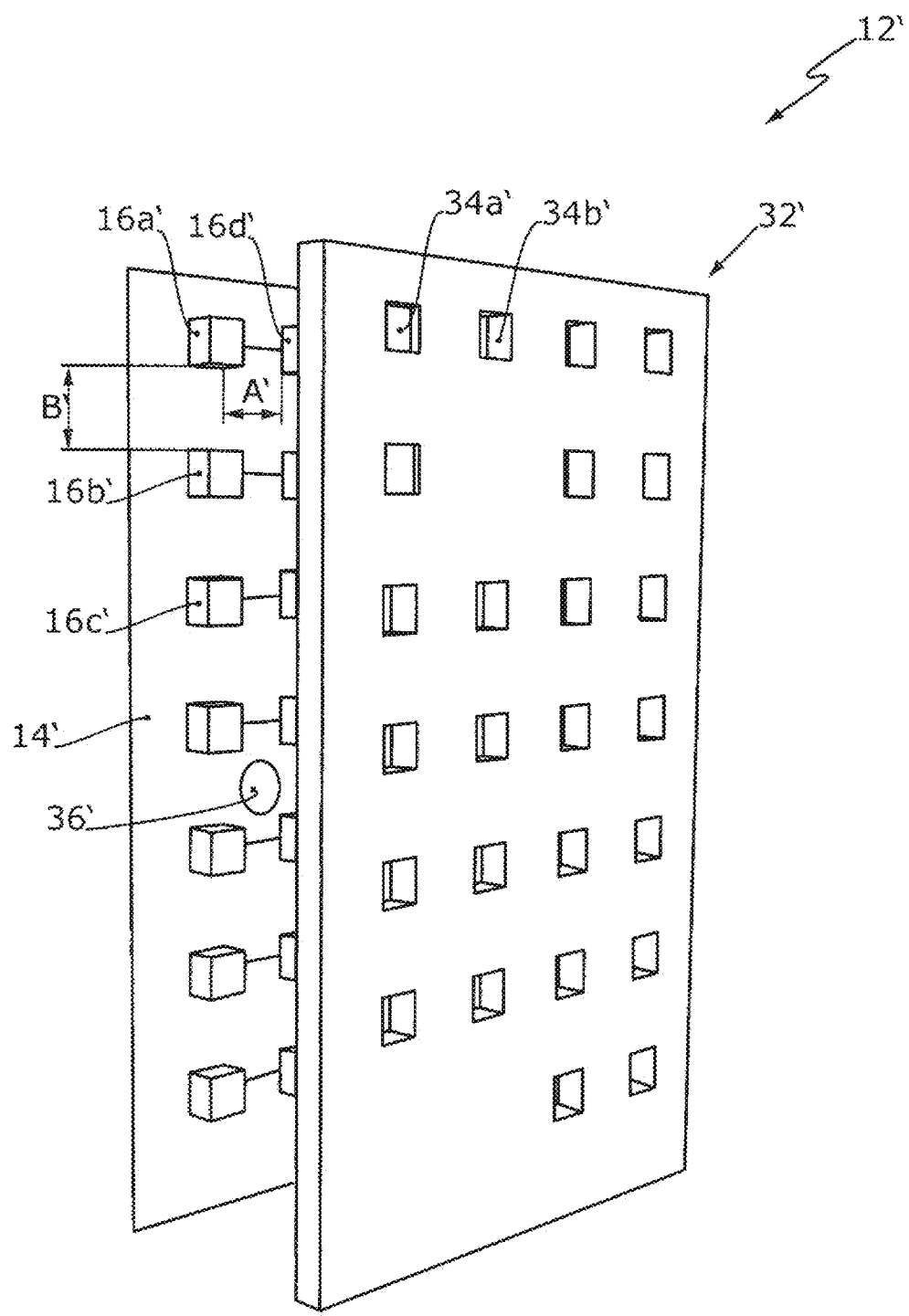
FIG. 4 is a perspective view of an illuminated display having a perforated plate.

FIG. 4 shows an illuminated display 12', wherein the illuminated display 12' has a film 14' and a plurality of illumination means, of which for reasons of clarity in FIG. 2 only the illumination means 16*a*'-16*d*' are provided with a reference numeral. In contrast to the illuminated display 12' according to FIG. 1, the illuminated display 12*a* according to FIG. 2 has a non-transparent film 14, that is to say, a film which reduces light by a minimum of 80%. The illumination means 16*a*'-16*d*' are spaced apart in rows with a spacing A' and spaced apart in columns with a spacing B'. The spacings A', B' are between 10 mm and 60 mm. In the embodiment according to FIG. 4, the spacings A' and B' are of identical size.

The side of the film 14' which has the illumination means 16*a*'-16*d*' is partially concealed by a plate 32'. As a result of the plate 32', the illuminated display 12' is given increased stability. A poster or the like (not shown) can thereby be secured to the side of the plate 32 facing away from the film 14'. Furthermore, the poster or the like (not shown) can later be removed without damaging the illuminated display 12'. The plate 32' has a plurality of recesses of which for reasons of clarity in FIG. 2 only the recesses 34*a*', 34*b*' are provided with a reference numeral. The recesses 34*a*', 34*b*' are each in alignment with associated illumination means 16*a*'-16*d*'. The recess 34*a*' is in this instance constructed in the form of a recess which reduces the thickness of the plate 32', whilst the recess 34*b*' is constructed in the form of a through-recess. In order to reduce the weight of the illuminated display 12, the film 14 has a film through-recess 36'.

Figure 5:
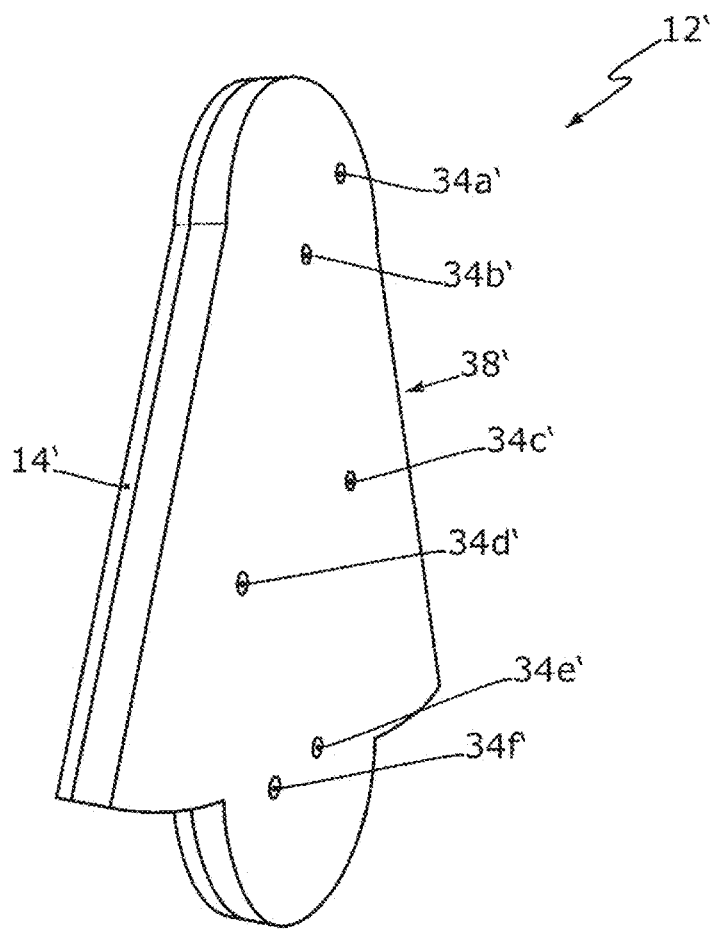
FIG. 5 is a perspective view of an illuminated display having a panoramic roof.

FIG. 5 shows another illuminated display 12'. The illuminated display 12' has a film 14' on which a plurality of illumination means (not shown) are arranged. The illuminated display 12' has a panoramic roof 38' for a motor vehicle. According to FIG. 5, the panoramic roof 38' is constructed in the form of a planar plate. Alternatively, the panoramic roof 38'—in the same manner as the plate 32' according to FIG. 2—may have at least one curvature. The film 14' can in this instance closely fit the curvature. The panoramic roof 38' has a plurality of recesses 34*a*'-34*f*'. Individual recesses 34*a*'-34*f*' may be constructed in the form of recesses or through-recesses. The recesses 34*a*'-34*f*' may be in alignment with illumination means (not shown) which are arranged on the film 14'.

At least one illumination means (not shown), for example, the illumination means which is associated with the recess 34*b*' may have a high-power LED. The high-power LED has in this instance a greater light power than the LEDs of the additional illumination means (not shown). The high-power LED can thereby be used as a reading light.

Figure 6:
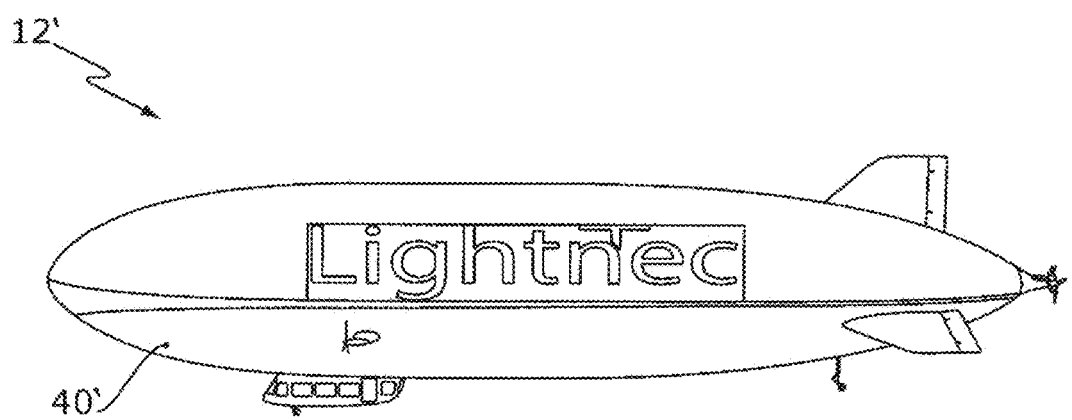
FIG. 6 is a perspective view of an illuminated display having a flying device.

FIG. 6 shows another illuminated display 12' which has a flying device 40' in the form of an airship. The illuminated display 12' has a large number of illumination means (not shown in detail) which can be individually controlled and by means of which in the present example according to FIG. 4 a logo is displayed. The illuminated display 12' according to FIG. 6 thereby constitutes an advertising medium which can be used in a flexible manner.

Figure 7A:
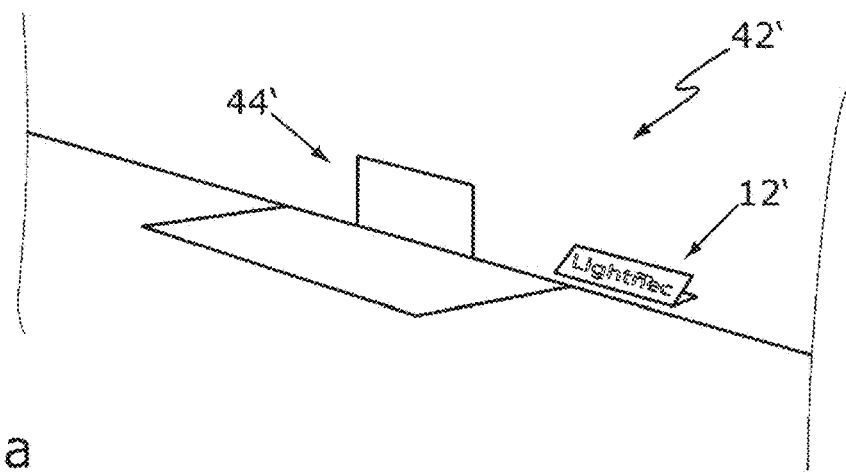
FIGS. 7a-7c are different perspective views of an illuminated display having a cam carpet.

FIG. 7*a* shows a portion of a football pitch 42' with a goal 44' and an illuminated display 12' which is laid flat on the ground in the form of a cam carpet. A logo on the illuminated display 12' appears from the perspective shown in FIG. 7*a* to be undistorted and to protrude plastically from the ground. The perspective shown in FIG. 7*a* corresponds to the perspective of a main camera which is located approximately 20 m above the side line at the height of the centre line.

Figure 7B:
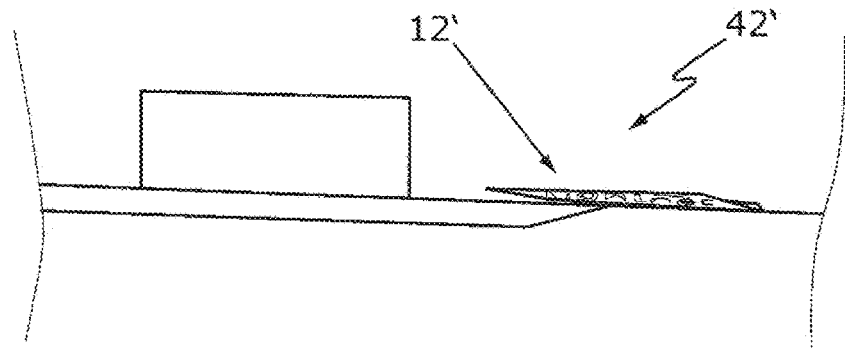

FIG. 7*b* shows the football pitch 42' from the perspective of a football player. From his perspective, the reproduction of the illuminated display 12' appears distorted. FIG. 7*b* shows that the cam carpet ("advertising carpet") is located flat on the ground so that it does not form a physical obstacle for the football player so that there is no increased risk of injury for the football player as a result of the cam carpet.

Figure 7C:
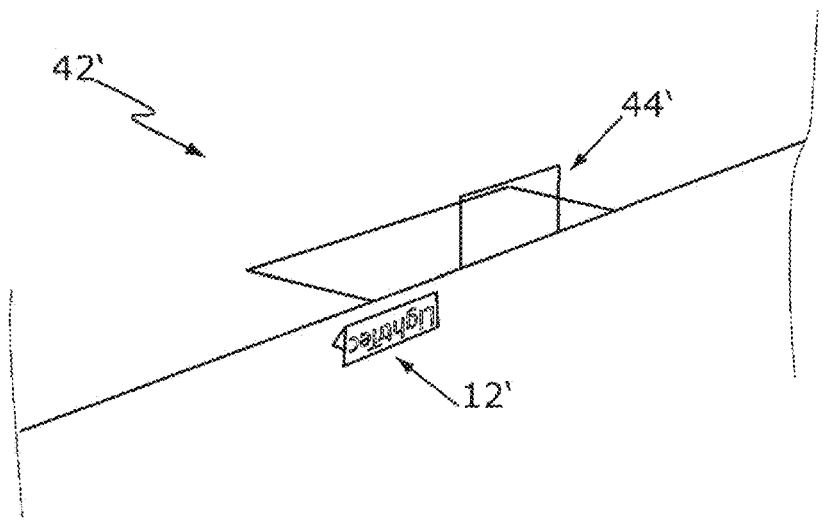

FIG. 7c shows the football pitch 42' from the perspective of a spectator in the stands behind the goal 44'. FIG. 7c shows that in this instance a distorted view of the illuminated display 12' is also produced. The construction of an illuminated display 12' in the form of a cam carpet affords the advantage that the image display thereof—in contrast to a statically printed cam carpet—can be animated and changed. Even from a perpendicular perspective, videos which are displayed in a distorted manner and which are displayed in a non-distorted manner from a camera viewpoint can be achieved with the illuminated display 12' according to the invention.

Figure 8A:
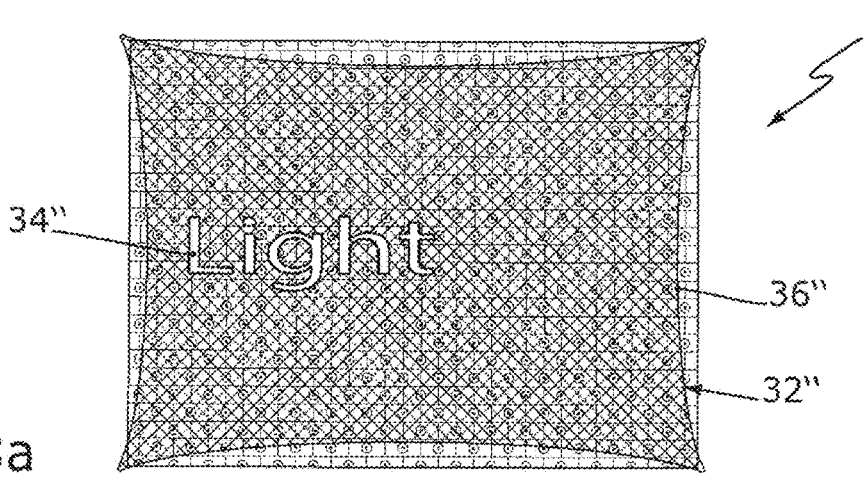
FIG. 8a is a plan view of another illuminated display having a plurality of illumination means in the switched-off state.

FIG. 8a shows an illuminated display 12" with a cover 32". The cover 32" has a pattern 34" which is constructed in the form of the logo "Light". The cover 32" has a light-permeable fabric 36". The fabric 36" is constructed in particular in the form of a nylon fabric.

Figure 8B:
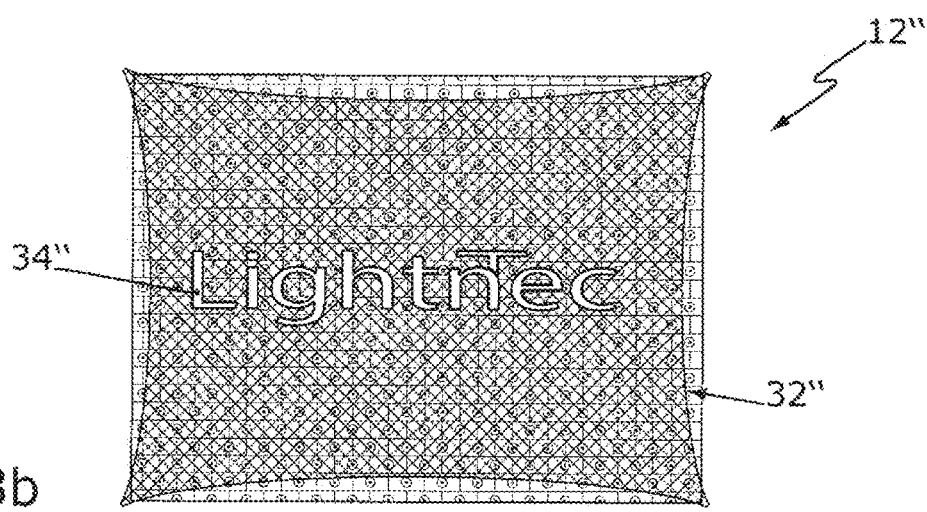
FIG. 8b is a plan view of the illuminated display according to FIG. 8a with a plurality of switched-on illumination means.

FIG. 8b shows an illuminated display 12" according to FIG. 8a, wherein a plurality of illumination means which are not indicated in greater detail in FIG. 8b for reasons of clarity are switched on and form the logo "nTec".

Figure 8C:
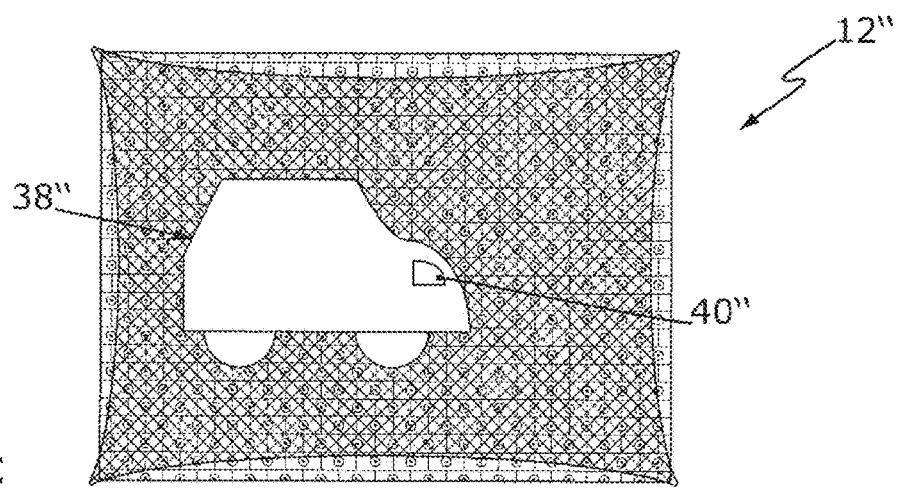

FIG. 8c shows the illuminated display 12", wherein, as a result of the brightness of the illumination means of the illuminated display 12" which are not indicated in greater detail in FIG. 8c for reasons of clarity, the pattern 34" (see FIG. 8b) is practically not visible for an observer of the illuminated display 12". Instead, a vehicle 38" is displayed by the illuminated display 12". The display of the illuminated display 12" can be varied and animated as desired. For example, the illuminated display 12" can be operated in such a manner that an indicator 40" of the vehicle 38" flashes.

Figure 9:
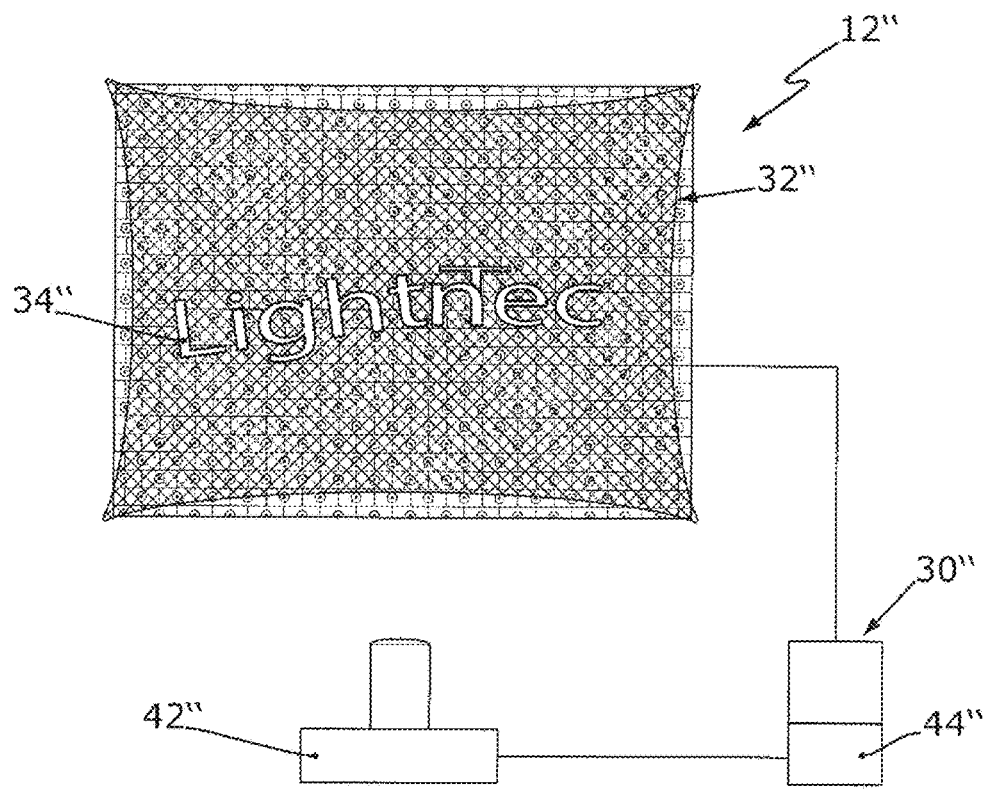
FIG. 9 is a plan view of another illuminated display with a correction device.

FIG. 9 shows an illuminated display 12" whose cover 32" is installed in a distorted manner. The orientation of the pattern 34" thereby does not correspond to the reproduction of the illuminated display 12". However, the illuminated display 12" has a camera 42" which is connected to a control device 30". The control device 30" has a correction device 44" which using the signal of the camera 42" is constructed to adapt the reproduction of the illuminated display 12" in accordance with the cover 34".

Figure 10:
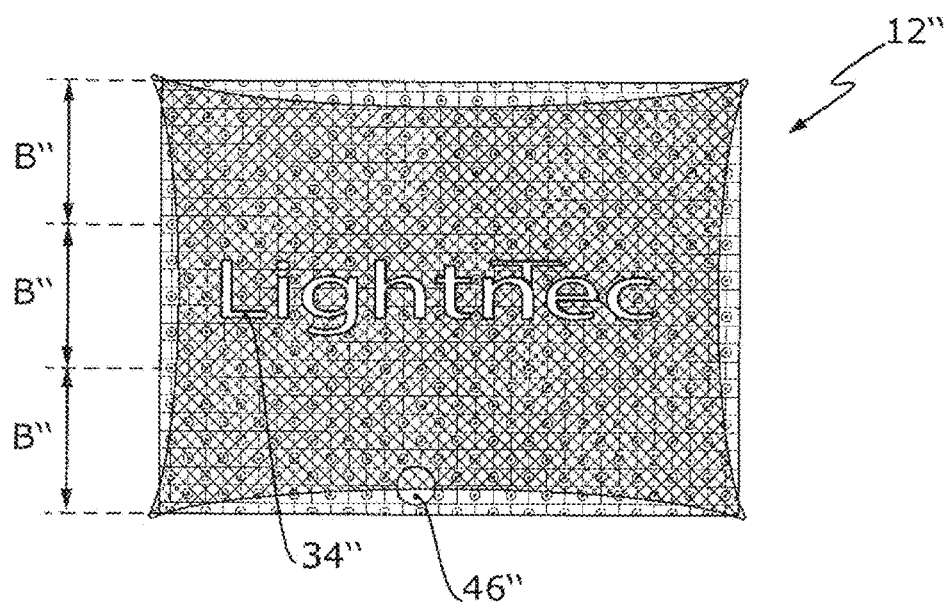
FIG. 10 is a plan view of another illuminated display with a through-recess.

FIG. 10 shows an illuminated display 12" which is composed of a plurality of paths of the width B". In the case of the illuminated display 12" according to FIG. 10, the pattern 34" is constructed by means of fluorescent colour. The illuminated display 12" has at least one UV light source which is not provided with a reference number in FIG. 10 so that the logo "Light" becomes visible for an observer only when the UV light source is switched on. For wind load and weight reduction, the illuminated display 12" has a film through-recess 46".

FIG. 11 shows an illuminated display 12" with a stele 48". The stele 48" has a first segment of the illuminated display 12" in front of which a cover 32" is arranged. The stele 48" may at the rear side of the stele 48" which is not visible in FIG. 11 have another segment of the illuminated display 12" which is at least partially covered by another cover 32".

FIG. 12 shows a portion of a building 50" with a wall 52". On the wall 52" an illuminated display 12" is arranged. The illuminated display 12" is constructed in the form of a routing system. Alternatively or additionally to the wall 52", a ceiling (not shown) of the building 50" may have an illuminated display which is constructed in the form of a routing system.

FIG. 13 shows a segment 64 of an illuminated display described above. The segment 64 has a base member 66 and a control unit 68. The base member 66 is constructed to be so bendable and the control unit 68 is constructed to be so small that the segment 64 can be rolled with an inner radius R of less than 50 mm.

FIG. 14a shows a device 70 for producing above-described segments of an illuminated display. The device 70 has an endless chain 72 which is partially penetrated by at least one radiant heater 74. The endless chain 72 has a plurality of plate-like segments 76 which are connected to each other. A plurality of sequential base members 78 of an illuminated display are—in a state processed from roller to roller—moved past the radiant heaters 74 parallel with segments 76. The endless chain 72 is cooled outside a housing 80 of the device 70.

FIG. 14b shows a segment 76, wherein it can be seen that the segments 76 have a through-recess 82 through which the base member 78 is irradiated. The segments consequently act as a heat shield for the heat-sensitive base member 78 (see FIG. 14a). Only regions which need to be provided with a component are irradiated through the through-recess 82. Preferably, the segments 76 are constructed in an identical manner.

What is claimed is:

1. An illuminated display for displaying an image or film, the illuminated display comprising:
  a) a plurality of illumination means;
  b) a strip conductor arrangement having a planar base member and a plurality of strip conductors which are arranged on the base member configured for the power supply of the illumination means, wherein the illumination means are arranged at least indirectly on the strip conductor arrangement;
  wherein the base member is constructed in the form of a film having an independent, thin, insulating sheet having a thickness of less than 3 mm;
  wherein:
    i) there is arranged on the base member a control unit which has an illumination means driver and a microcontroller control for receiving and decoding image data or film data, on the basis of which the illumination means can be controlled; and/or
    ii) the control unit has a printed circuit board which is arranged on the strip conductor arrangement by means of a joining method;
  wherein the majority of the illumination means have LEDs; and
  wherein:
    i) the base member is optically so permeable perpendicularly to the main plane thereof that it reduces visible light by a maximum of 40%; and/or
    ii) the illuminated display has at least three illumination means which are arranged on the base member, wherein each of these illumination means has a spacing of at least 10 mm with respect to the next adjacent illumination means, and wherein a first illumination means is spaced apart in a first direction from a second illumination means and is spaced apart in another second direction from a third illumination means;
  wherein the illuminated display has a plurality of identical segments each comprising a control unit, an illumination means and a strip conductor arrangement, wherein the illuminated display has a control device for controlling a plurality of control units; and
  wherein the control unit occupies a maximum of 10% of the segment face and the base members of the segments are constructed in a flexible manner so that the segments can be rolled with the control unit with an inner radius of less than 50 mm.

2. The illumination display according to claim 1, wherein the strip conductors constitute at least a portion of a cover of the base member, which cover partially covers the base member, wherein the cover reduces the optical permeability of the strip conductor arrangement perpendicularly to the main plane of the base member by at least 80%, wherein the cover over at least 85% of the strip conductor arrangement covers the base member by from 30% to 60%, measured in a 1 cm² large planar square, in order to achieve a substantially uniform mean optical permeability of the strip conductor arrangement.

3. The illuminated display according to claim 1, wherein the strip conductor arrangement has a plurality of strip conductor portions which are redundant or functionless for connecting the illumination means.

4. The illuminated display according to claim 1, wherein the strip conductors are constructed from copper.

5. The illuminated display according to claim 1, wherein the majority of the illumination means have LEDs in the form of RGB LEDs.

6. The illuminated display according to claim 1, wherein the illuminated display has a control unit for controlling the illumination means, wherein the control unit is arranged in an edge region of the illuminated display and the power supply of the illumination means is carried out with a parallel connection method from the control unit so that a portion of the illuminated display spaced apart from the control unit can be removed from the control unit without impairing the functionality of the illumination means remaining on the illuminated display.

7. The illuminated display according to claim 1, wherein the base member is produced from a thermoplastic plastics material.

8. The illuminated display according to claim 1, wherein the segments can be rolled with the control unit with an inner radius of less than 30 mm.

9. The illuminated display according to claim 1, wherein the segments can be rolled with the control unit with an inner radius of less than 20 mm.

10. The illuminated display according to claim 1, wherein the illuminated display has a cover, wherein the cover at the side thereof facing away from the illumination means has a pattern whose appearance can be modified for an observer of the illuminated display.

11. The illuminated display according to claim 10, wherein the cover has a printed fabric.

12. A method for producing an illuminated display according to claim 1, wherein the base carrier is processed from roller to roller.

13. The method according to claim 12, wherein the connection of the illumination means to the base member is carried out by means of reflow soldering in a reflow oven, wherein the base member is protected by means of a heat shield which has through-recesses in the region of the illumination means, and wherein the heat shield is constructed in the form of an endless chain which cools outside the heated region of the reflow oven.

14. A method for operating an illuminated display according to claim 1, wherein the illumination means are arranged in a matrix are controlled in rows one after the other, wherein
  a) the rows are each controlled for between 100 ms and 1 s; and/or
  b) individual rows are not controlled.

15. The illumination display according to claim 1, wherein the base member is constructed in the form of a film having an independent, thin, insulating sheet having a thickness of less than 1 mm.

16. The illuminated display according to claim 1, wherein the control unit occupies a maximum of 5% of the segment face and the base members of the segments are constructed in a flexible manner so that the segments can be rolled with the control unit with an inner radius of less than 50 mm.

17. The illuminated display according to claim 1, wherein the control unit occupies a maximum of 1% of the segment face and the base members of the segments are constructed in a flexible manner so that the segments can be rolled with the control unit with an inner radius of less than 50 mm.

* * * * *